United States Patent
Matsuda (10) Patent No.: US 9,445,514 B2
(45) Date of Patent: Sep. 13, 2016

(54) HANDLE AND DISPLAY DEVICE EQUIPPED WITH HANDLE

(71) Applicant: NEC Display Solutions, Ltd., Tokyo (JP)

(72) Inventor: Koji Matsuda, Tokyo (JP)

(73) Assignee: NEC DISPLAY SOLUTIONS, LTD., Tokyo (JP)

( * ) Notice: Subject to any disclaimer, the term of this patent is extended or adjusted under 35 U.S.C. 154(b) by 0 days.

(21) Appl. No.: 14/428,681

(22) PCT Filed: Sep. 19, 2012

(86) PCT No.: PCT/JP2012/073902
§ 371 (c)(1),
(2) Date: Mar. 17, 2015

(87) PCT Pub. No.: WO2014/045350
PCT Pub. Date: Mar. 27, 2014

(65) Prior Publication Data
US 2015/0223352 A1    Aug. 6, 2015

(51) Int. Cl.
*H05K 7/00* (2006.01)
*H05K 5/00* (2006.01)
*H05K 5/02* (2006.01)
*A47B 95/02* (2006.01)
*B25G 1/00* (2006.01)
*G06F 1/16* (2006.01)
*H04N 5/64* (2006.01)

(52) U.S. Cl.
CPC .............. *H05K 5/023* (2013.01); *A47B 95/02* (2013.01); *B25G 1/00* (2013.01); *G06F 1/1613* (2013.01); *H05K 5/0017* (2013.01); *H04N 5/64* (2013.01); *Y10T 16/44* (2015.01)

(58) Field of Classification Search
CPC ....................................................... F16M 13/00
USPC ...................................... 361/679.01–679.52
See application file for complete search history.

(56) References Cited

U.S. PATENT DOCUMENTS

2009/0152432 A1* 6/2009 Kunii ..................... F16M 11/10
248/398

FOREIGN PATENT DOCUMENTS

| JP | 2003-318555 A | 11/2003 |
| JP | 2005-266396 A | 9/2005 |
| JP | 2008-241964 A | 10/2008 |
| JP | 2012-074021 A | 4/2012 |

OTHER PUBLICATIONS

International Search Report (ISR) (PCT Form PCT/ISA/210), in PCT/JP2012/073902, dated Dec. 4, 2012.

* cited by examiner

*Primary Examiner* — Jerry Wu
(74) *Attorney, Agent, or Firm* — McGinn IP Law Group, PLLC (57) ABSTRACT

A display device (10) includes a display (12) used to display an image, and a handle (14) attached to a recess (13) formed in a rear face (12a) of the display (12). The handle having a Z-shape in a side view connects between a first holder (17) and a second holder (18) via a connecting part (19). The second holder (18) is projected outside the display device so as to achieve an easy-to-hold ability when the first mounting face (17a) of the first holder (17) is fixed to the recess (13) of the display device (10). The first holder (17) is kept inside the thickness of the display device (10) when the second mounting face (18a) of the second holder (18) is fixed to the recess (13).

14 Claims, 8 Drawing Sheets

HANDLE AND DISPLAY DEVICE EQUIPPED WITH HANDLE

TECHNICAL FIELD

The present invention relates to a handle used for various devices and a display device, such as a liquid crystal display and a plasma display, equipped with a handle

BACKGROUND ART

Figure 10:
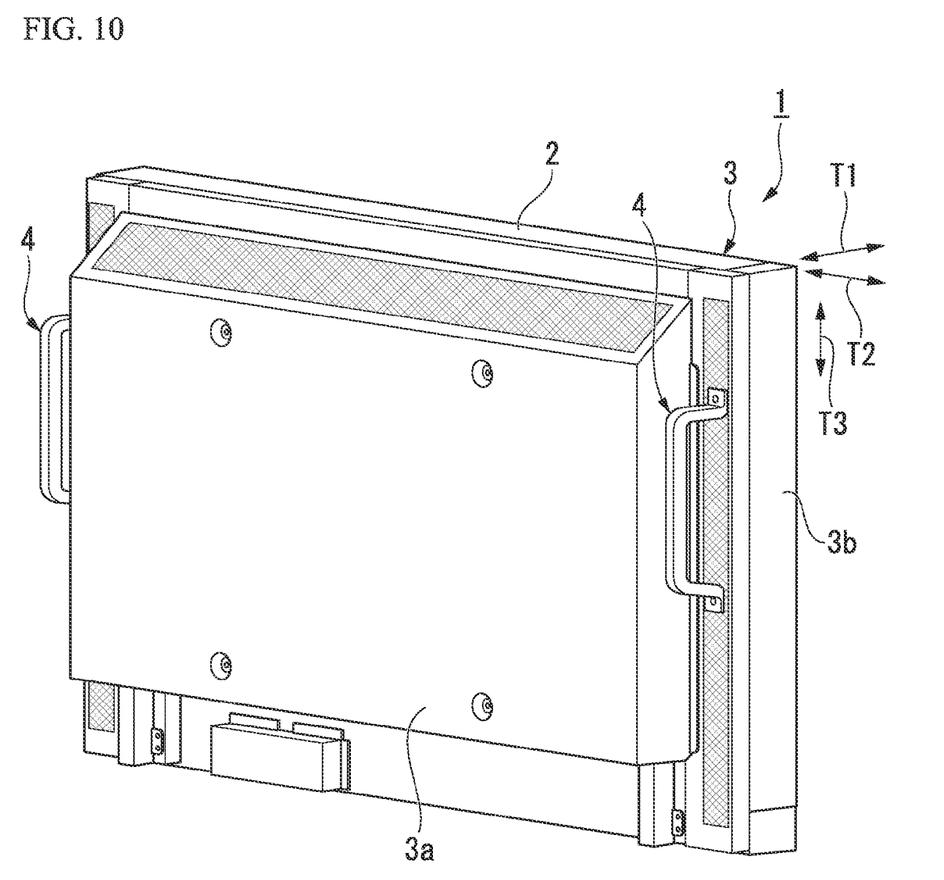
FIG. 10 is a perspective view showing the rear face of a conventional display device.

For example, Patent Literature Document 1 discloses a display device such as a liquid crystal display and a plasma display. As shown in FIG. 10, a display device 1 includes a display 3 formed in a rectangular shape, in which the peripheral face and the rear face of a display panel is covered with a frame body 2. Recently, the display device 1 needs to be increased in size while reduced in thickness; hence, a pair of handles 4 is attached to the opposite ends of a thin panel of a rear face 3a such that the display device 1 having a large size can be easily transported or facilitated at a desired site.

The handles 4 of the display device 1 are designed to place emphasis on an easy-to-hold ability and an easy-to-carry ability during movement or transportation; hence, it is necessary to secure a large gap between the holder of the handle 4 and the rear face of the display device, thus allowing an operator to easily hold the holder.

CITATION LIST

Patent Literature Document

Patent Literature Document 1: Japanese Patent Application Publication No. 2005-266396

SUMMARY OF INVENTION

Technical Problem

Since the display device 1 has been further reduced in thickness, the handles 4 are projected in the thickness direction of the display device 1, i.e. a rear direction T1, so as to form a sufficient gap with the rear face 3a of the display device 1 such that the handles 4 can be easily handled by an operator or user. However, this makes the handles 4 be further projected in the rear direction T1 rather than the rear face 3a of the display 1.

In this case, it is necessary to locate the display device 1 close to the wall face of a room or to fix the display device 1 on the wall face by use of wall-hanging fittings. However, this may cause a drawback in that it is difficult to locate the display device 1 at a position sufficiently close to the wall face due to the interference between the handles 4 and the wall face.

When a plurality of display devices 1 is located close to each other with rear faces thereof, it is necessary to secure an occupancy space for each display device 1 by the length of each handle 4 projecting from the rear face 3a. Even though the display device 1 is reduced in thickness, there is a drawback in that it is necessary to form a large gap between the display devices 1 located close to each other with rear faces.

To solve the above drawbacks, it is necessary to eliminate handles, which in turn causes another drawback in that it is difficult to carry the display device 1.

The present invention is created in consideration of the above problems, and therefore it is an object of the present invention to provide a handle which can be attached to various devices or display devices so as to selectively achieve an easy-to-hold ability or a reduction of an occupancy space, and a display device equipped with a handle.

Solution to Problem

The present invention is directed to a handle connecting between a first holder and a second holder via a connecting part. Herein, the first holder is equipped with a first mounting face to be fixed to a device while the second holder is equipped with a second mounting face to be fixed to a device. An angle formed between the center axis of the connecting part and the first mounting face is greater than an angle formed between the center axis of the connecting part and the second mounting face. Thus, either the first mounting face or the second mounting face is selectively attached to a device.

The present invention is directed to a display device equipped with a display used to display an image and a handle attached to the rear face of a display. Herein, the handle connects between a first holder and a second holder via a connecting part, and the first holder is equipped with a first mounting face to be fixed to the display while the second holder is equipped with a second mounting face to be fixed to the display. An angle formed between the center axis of the connecting part and the first mounting face is greater than an angle formed between the center axis of the connecting part and the second mounting face. Thus, either the first mounting face or the second mounting face of the handle is selectively attached to the display.

Advantageous Effects of Invention

According to a handle and a display device of the present invention, it is possible to selectively attach either a first mounting face or a second mounting face of a handle to a device or a display device, wherein it is possible to form a relatively large gap between a device or a display device and a handle whose first mounting face is attached to a device or a display device, thus achieving an easy-to-hold ability and an easy-to-carry ability with a handle. When the second mounting face of a handle is attached to a device or a display device, it is possible to form a relatively small gap between a handle and a device or a display device, thus reducing an occupancy space. This makes it possible to reduce the installation space of a device or a display device, thus improve the exterior appearance of a device or a display device. Additionally, it is easy for each user to attach a handle having a simple structure to any device.

DESCRIPTION OF EMBODIMENTS

A handle and a display device according to the embodiment of the present invention will be described with reference to FIGS. 1 to 7.

Figure 1:
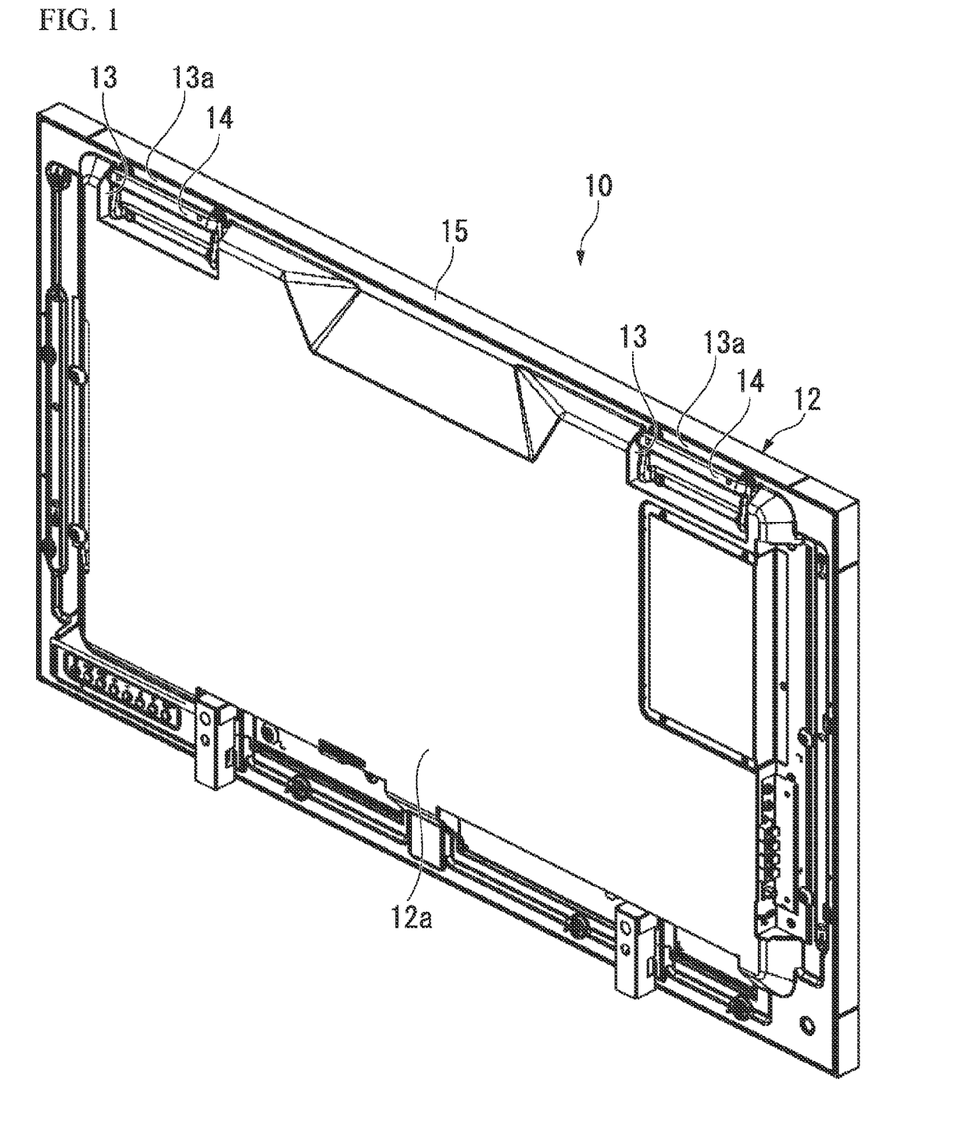
FIG. 1 is a perspective view showing a rear face of a display device according to an embodiment of the present invention.

As shown in FIG. 1, a display device 10 of the present embodiment includes a display 12 having a rectangular flat panel configured to display images and a pair of handles 14 attached to the upper portion of a rear face 12a of the display 12.

The display 12 includes a display panel such as a liquid crystal display panel and a plasma display panel, the rear face 12a having a rear cover used to cover drive units disposed at the rear face of a display panel, and a frame body 15 used to cover the rear face 12a and the peripheral face of a display panel. A pair of recesses 13 is formed in the upper portion of the rear face 12a of the display device 10, wherein each recess is formed with an L-shaped cross section using a side wall 13a and a base 13b.

The handles 14 are attached to the rear face 12a of the display device 10 such that an operator or user may hold the handles 14 with hands so as to easily carry, transport, and install the display device 10.

Figure 2A:
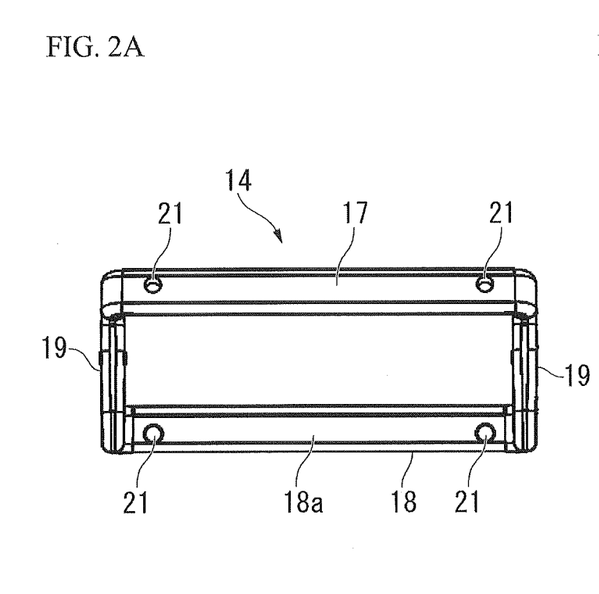
FIG. 2A is a front view of a handle of a display device according to the embodiment.
Figure 2B:
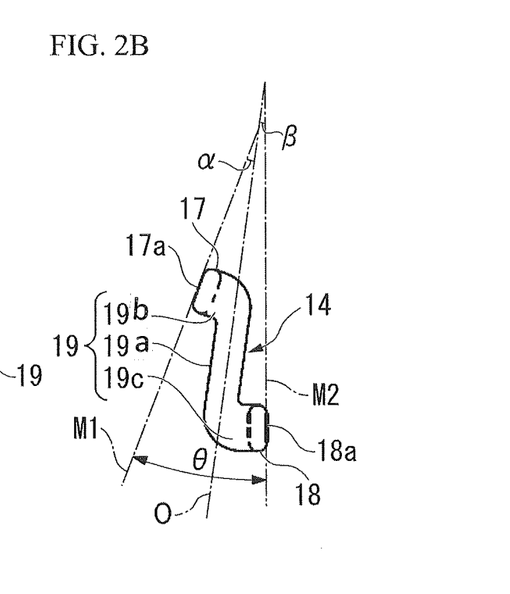
FIG. 2B is a side view of a handle shown in FIG. 2A.
Figure 3:
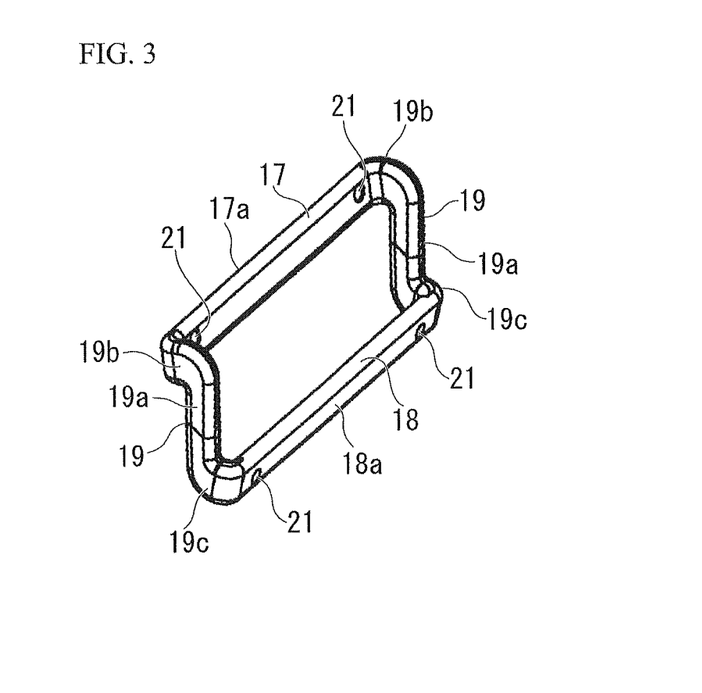
FIG. 3 is a perspective view of a handle

As shown in FIGS. 2A, 2B, and 3, for example, the handle 14 entirely having a rectangular shape in a front view includes a first holder 17 and a second holder 18, having flat shapes, which are formed in parallel and separated form each other with the predetermined distance. The first holder 17 and the second holder 18 are connected together via a pair of connecting parts 19 with the opposite ends thereof.

The first holder 17 has a first mounting face 17a, having a planar shape, which contacts the side wall 13a of the recess 13 formed on the rear face 12a of the display 12. A pair of bolt holes 21 is bored in the first holder 17 such that the first holder 17 can be fixed to the side wall 13a by means of fixing members such as screws. The second holder 18 has a second mounting face 18a, having a planar shape, which contacts the side wall 13a of the recess 13 formed on the rear face 12a of the display 12. A pair of bolt holes 21 is bored in the second holder 18 such that the second holder 18 can be fixed to the side wall 13a by means of fixing members such as screws. The first mounting face 17a and the second mounting face 18a are formed in the opposite faces of the handle 14 each directing outwardly.

As shown in the side view of FIG. 2B, the connecting part 19 of the handle 14, entirely having a Z-shape, includes an axial part 19a having a straight rod shape, a first projection 19b and a second projection 19c which are curved in opposite directions and projected from the upper and lower ends of the axial part 19a. Additionally, the first projections 19b are connected to the opposite ends of the first holder 17 while the second projections 19c are connected to the opposite ends of the second holder 18.

In FIG. 2B showing a side view of the handle 14, O denotes a center axis of the axial part 19a of the connecting part 19; M1 denotes an extension along the first mounting face 17a of the first holder 17; and M2 denotes an extension along the second mounting face 18a of the second holder 18. An acute angle θ is formed between the first mounting face 17a and the second mounting face 18a, i.e. between the extensions M1 and M2. It is preferable that the angle θ range from 15° to 25°. For example, the angle θ is set to 20°.

The range of the angle θ may be appropriately varied depending on the thickness of the recess 13 of the display device 1 (i.e. the width of the base 13b) and the length between the first mounting face 17a and the second mounting face 18a of the connecting part 19 of the handle 14.

Additionally, an angle α is formed between the first mounting face 17a and the center axis O of the axial part 19a while an angle β is formed between the second mounting face 18a and the center axis O of the axial part 19a, wherein α>β.

Figure 5:
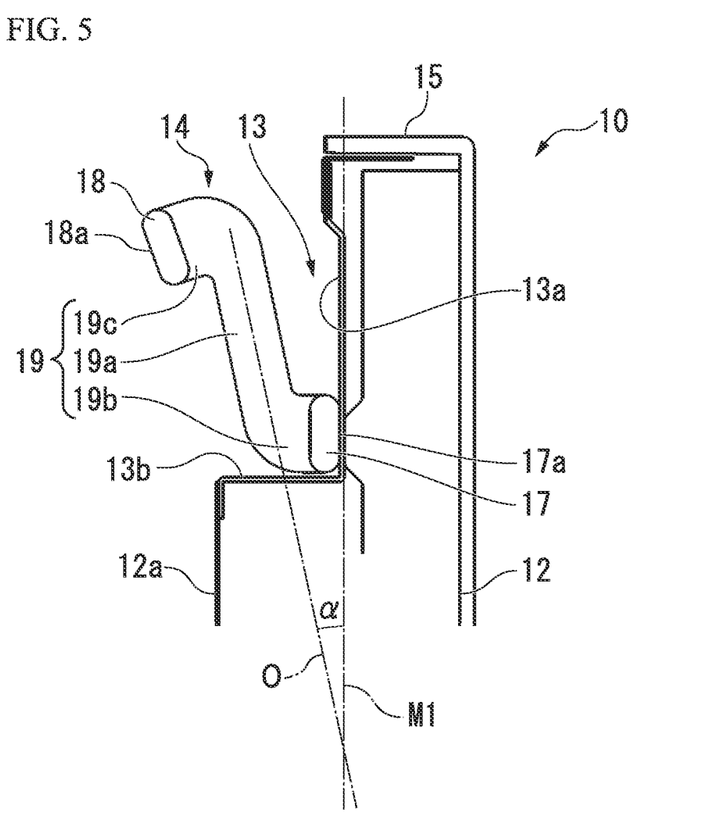
FIG. 5 is a cross-sectional view showing the attached state of a handle shown in FIG. 4.

When the first mounting face 17a of the first holder 17 of the handle 14 is attached to the side wall 13a of the recess 13 of the display device 10, the second holder 18 of the handle 14 is projected outwardly from the side face 12a of the display device 10 so as to increase the distance between the second holder 18 and the side wall 13a of the recess 13, thus making it easy for each user to hold the second holder 18 (see FIG. 5). When the second mounting face 18a of the second holder 18 of the handle 14 is attached to the side wall 13a of the recess 13 of the display device 10, the first holder 17 of the handle 14 can be kept in the thickness of the recess 13 of the display device 10 (i.e. the width of the base 13b) so as to reduce the distance between the first holder 17 and the side wall 13a of the recess 13, thus reducing the occupancy space of the display device 10 (see FIG. 7).

With regard to the relationship (α>β) between the angle α formed between the first mounting face 17a and the center axis O of the axial part 19a and the angle β formed between the second mounting face 18a and the center axis O of the axial part 19a, an obtuse angle is formed between the axial part 19a and the first projection 19b while an acute angle or a right angle is formed between the axial part 19a and the second projection 19c; however, the present invention is not necessarily limited to this relationship. It is necessary to establish at least the relationship (α>β); hence, any angle such as either an obtuse angle or an acute angle can be formed between the axial part 19a and the first projection 19b and between the axial part 19a and the second projection 19c.

The display device 10 of the present embodiment has the aforementioned structure. Next, the attaching structure of the handle 14 in the display device 10 will be described with reference to FIGS. 4 to 7.

Figure 4:
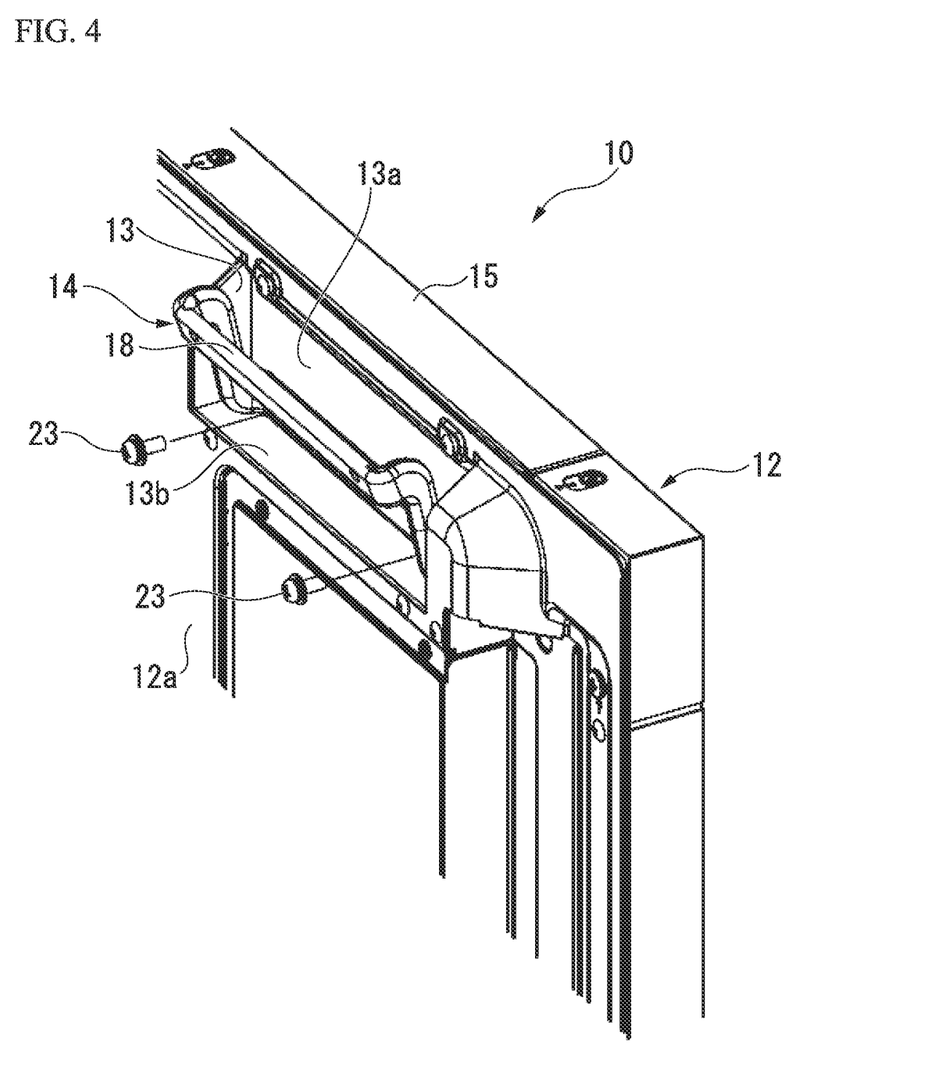
FIG. 4 is a perspective view showing the attached state of a handle with a first mounting face attached to the rear face of a display device.

In the attaching structure of the handle 14 in the display device 10 shown in FIGS. 4 and 5, it is necessary to place emphasis on an easy-to-carry ability of the display device 10. For this reason, the handle 14 is fixed using screws 23 with the first mounting faces 17a of the first holders 17 closely contacting the side wall 13a of the recess 13 formed in the upper portion of the rear face 12a of the display 12.

In this structure, a relatively large intersecting angle α is formed between the center axis O of the axial part 19a of the connecting part 19 of the handle 14 and the extension M1 of the first mounting face 17a fixed to the side wall 13a while an obtuse intersecting angle is formed between the axial part 19a of the connecting part 19 and the first projection 19b. For this reason, the connecting part 19 of the handle 14 is inclined in a direction such that the connecting part 19 will be distanced from the display device 10 while the second holder 18 is projected outwardly from the base 13b of the recess 13, i.e. in the rear direction, thus setting a large gap between the holdable second holder 18 and the side wall 13a of the display device 10.

As shown in FIG. 5, the center axis O of the axial part 19a of the connecting part 19 may intersect the extension M1 of the first mounting face 17a of the first holder 17 at a position above the display device 10.

In this case, it is easy for an operator to hold the second holder 18 of the handle 14 with his/her hand.

Figure 6:
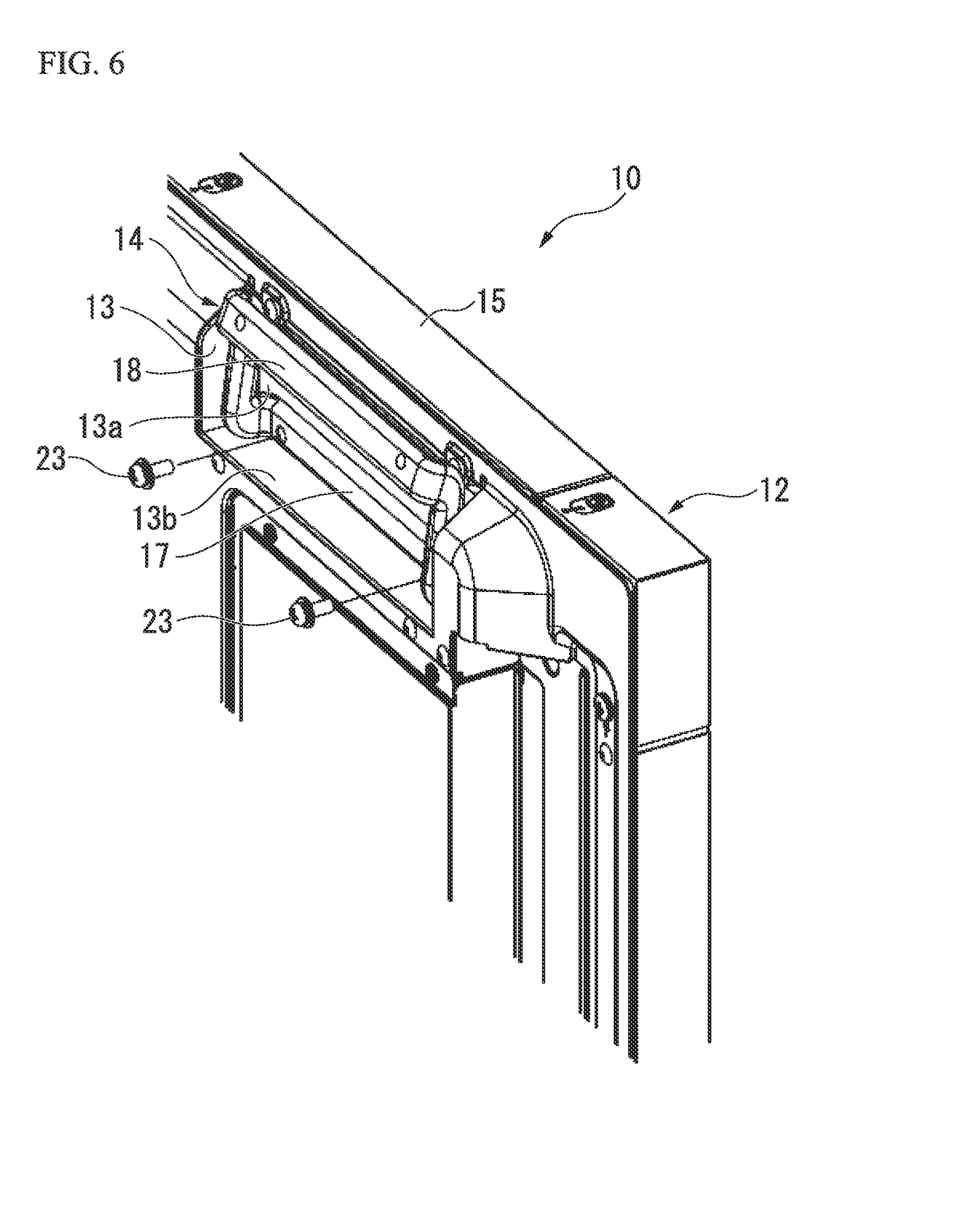
FIG. 6 is a perspective view showing the attached state of a handle with a second mounting face attached to the rear face of a display device.
Figure 7:
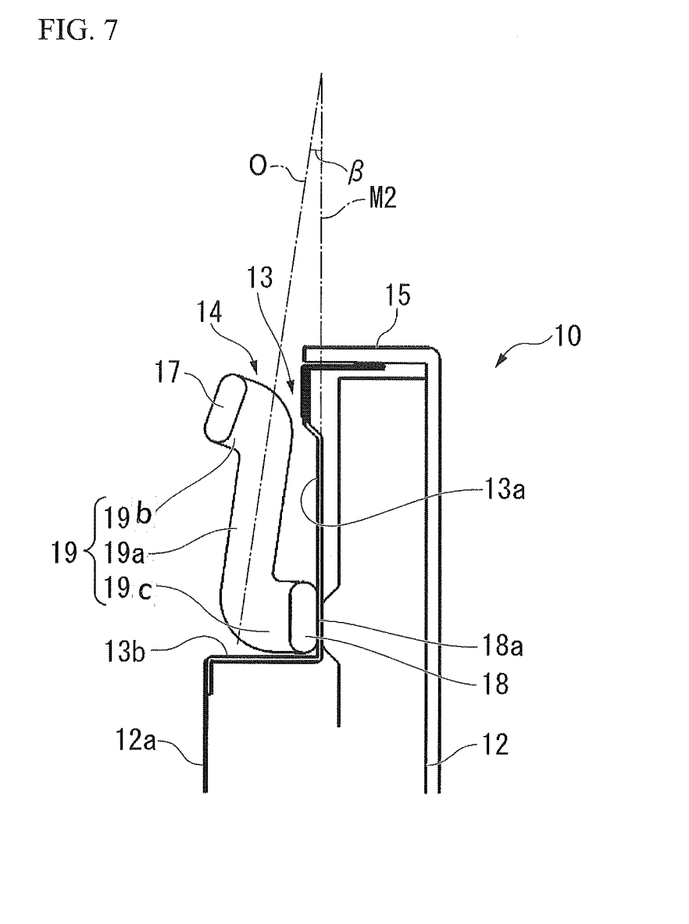
FIG. 7 is a cross-sectional view showing the attached state of a handle shown in FIG. 6.

In the attaching structure of the handle 14 in the display device 10 shown in FIGS. 6 and 7, it is necessary to place emphasis on the installation of the display device 10 at a position close to the wall face of a room. For this reason, the handle 14 is fixed using screws 23 with the second mounting faces 18a of the second holders 18 closely contacting the side wall 13a of the recess 13.

In this structure, a relatively small intersecting angle β is formed between the center axis O of the axial part 19a of the connecting part 19 of the handle 14 and the extension M2 of the second mounting face 18a fixed to the side wall 13a while an acute intersecting angle is formed between the axial part 19a o the connecting part 19 and the second projection 19c. As shown in FIG. 7, the center axis O of the axial part 19a of the connecting part 19 may intersect the extension M2 of the second mounting face 18a of the second holder 18 at a position outside and above the display device 10.

For this reason, the connecting part 19 of the handle 14 is inclined in a direction such that the connecting part 19 will approach the display device 10 while the first holder 17 is located in the base 13b of the recess 13 such that the first holder 17 will not be projected to the exterior, i.e. in the rear direction. In this case, it is possible for an operator to carry and transport the display device 10 with his/her hand holding the first holder 17.

In the above structure, the handle 14 will not be projected outside the thickness of the display device 10 due to a small space for holding the handle 14 of the display device 10; hence, it is possible to install the display device 10 with the rear face 12a closely contacting the wall face of a room. Additionally, it is possible to attach the display device 10 to closely contact or approach a wall face in a wall-mounting manner by use of wall-hanging fittings.

Moreover, it is possible to closely locate two display devices 10 with rear faces such that the rear faces 12 of the display devices 10 can closely contact or approach each other.

According to the display device 10 of the present embodiment, it is possible to selectively attach either the first mounting faces 17a or the second mounting faces 18a of the handle 14 to the side wall 13a of the recess 13 as necessary. When the first mounting faces 17a of the handle 14 are fixed to the side wall 13a of the recess 13, the second holder 18 will be projected outwardly in the thickness direction of the display device 10, thus making it easy for each user to hold the second holder 18. When the second mounting faces 18a of the handle 14 are fixed to the side wall 13a of the recess 13, it is possible to fix the handle 14 in the thickness of the recess 13 of the display device 10, thus requiring the occupancy space with the thickness of the display device 10. Thus, it is possible to attach the display device 10 close to a wall face, or it is possible to locate a plurality of display devices 10 with rear faces contacting or approaching each other. This may reduce the installation space while improving the exterior appearance.

The present invention is not necessarily limited to the handle 14 and the display device 10 equipped with the handle 14 according to the foregoing embodiment; hence, it is possible to appropriately employ any variations without changing or departing from the subject matter of the present invention.

Hereinafter, variations of the handle 14 according to the embodiment of the present invention will be described using the same reference signs for the same or similar parts or members in the foregoing embodiment.

Figure 8:
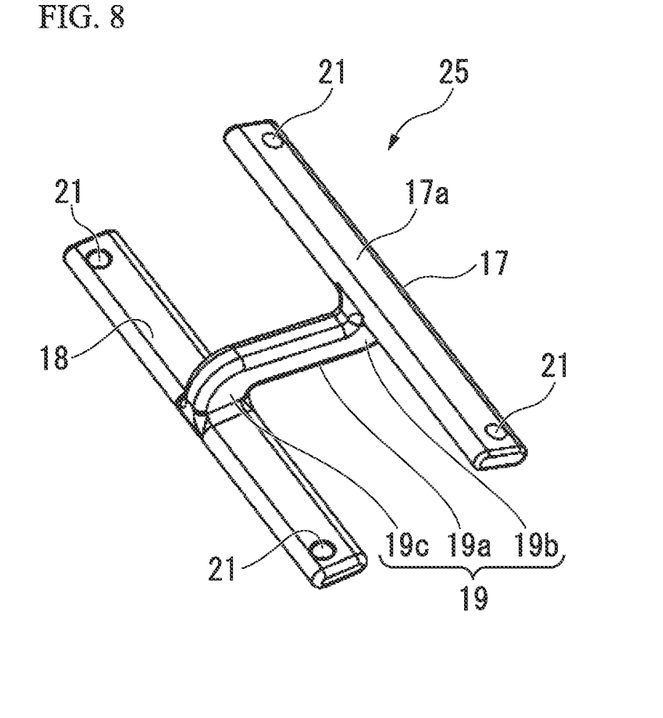
FIG. 8 is a perspective view of a handle according to a first variation.

FIG. 8 is a perspective view showing a handle 25 according to a first variation.

In the handle 25 shown in FIG. 8, the connecting part 19 is connected to the center positions of the first holder 17 and the second holder 18 in the longitudinal direction.

Figure 9:
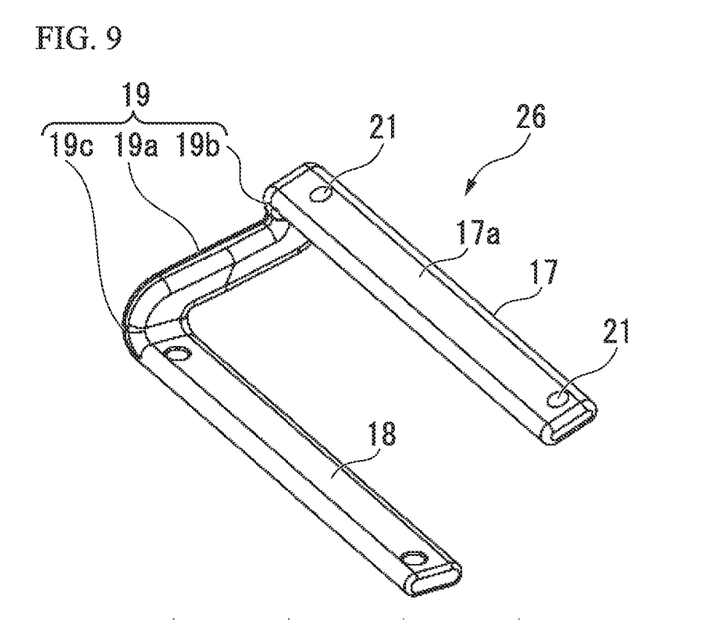
FIG. 9 is a perspective view of a handle according to a second variation.

FIG. 9 is a perspective view showing a handle 26 according to a second variation. In the handle 26, the connecting part 19 is connected to one ends of the first holder 17 and the second holder 18.

The handles 26 and 26 according to the first and second variations may demonstrate the same operation and effect as the handle 14 according to the foregoing embodiment.

In the display device 10 of the foregoing embodiment, a pair of recesses 13 is formed in the upper portion of the rear face 12a of the display device 10, wherein the handles 14 are fixed to the side walls 13a; however, the display device 10 of the present invention is not necessarily limited to this structure. For example, it is possible to form a single recess 13, used to fix the handles 14, 25, or 26, at the center of the upper portion of the rear face 12a. Alternatively, it is possible to form a pair of recesses 13 in the opposite sides of the rear face 12a of the display device 10, wherein each of the handles 14, 25, and 26 may be selectively fixed to the first and second holders 17 and 18 in a vertical direction.

In the display device 10, the recesses 13 are each formed at the position which each of the handles 14, 25, and 26 should be fixed to; however, it is not necessary to form the recesses 13. Similar to the conventional-art display device shown in FIG. 10, for example, a rear cover having a protuberance shape, used to cover drive units of a display panel, may be formed in the rear face 12a of the display 12 such that the periphery thereof is reduced by one-step of thickness so as to form an edge area, which each of the handles 14, 25, and 26 can be fixed to.

The handles of the present invention are not necessarily limited to ones attached to display devices; hence, these handles can be appropriately attached and fixed to any devices. In this case, it is possible to demonstrate the same operation and effect as the handles attached to display devices.

INDUSTRIAL APPLICABILITY

The present invention is designed to selectively fix handles, connecting between first and second holders via connecting parts, to rear faces of display devices or other devices. Even when rear faces of display devices or other devices are reduced in thickness, it is possible to project the second holder outside a display device or another device so as to achieve an easy-to-hold ability when each handle is fixed with the first mounting face of the first holder, and it is possible to prevent the first holder from being projected outside a display device or another device so as to reduce an installation space when each handle is fixed with the second mounting face of the second holder.

REFERENCE SIGNS LIST 10 display device
12 display 12a rear face
13 recess
13a side wall
14, 25, 26 handle
17 first holder
17a first mounting face
18 second holder
18a second mounting face
19 connecting part
19a axial part

The invention claimed is:

1. A handle comprising:
a first holder;
a second holder; and a first connecting part,
wherein the first holder connects the second holder via opposite ends of the first connecting part,
wherein the first holder is equipped with a first mounting face to be fixed to at least one hole of a device while the second holder is equipped with a second mounting face to be fixed to the at least one hole of the device,
wherein a first angle formed between a center axis along a longitudinal direction of the first connecting part and the first mounting face is greater than a second angle formed between the center axis of the first connecting part and the second mounting face, and
the first and second mounting faces face to opposite sides of the center axis,
wherein either the first mounting face or the second mounting face is selectively attached to the device.

2. A display comprising:
the display used to display an image; and a handle attached to a rear face of the display, the handle including:
a first holder; a second holder; and a first connecting part,
wherein the first holder connects the second holder via opposite ends of the first connecting part,
wherein the first holder is equipped with a first mounting face to be fixed to at least one hole of the rear face while the second holder is equipped with a second mounting face to be fixed to the at least one hole,
wherein a first angle formed between a center axis along a longitudinal direction of the first connecting part and the first mounting face is greater than a second angle formed between the center axis of the first connecting part and the second mounting face, and
the first and second mounting faces face to opposite sides of the center axis,
wherein either the first mounting face or the second mounting face of the handle is selectively attached to the display.

3. The display device according to claim 2, wherein the handle is projected outside the display in a thickness direction when the first mounting face of the first holder is attached to the rear face of the display, and
wherein the handle is kept inside a thickness of the display when the second mounting face of the second holder is attached to the rear face of the display.

4. The display device according to claim 2, wherein either the first mounting face or the second mounting face is attached to a recess or an edge having a small thickness formed in the rear face of the display.

5. The handle of claim 1, wherein the first holder and the second holder are spaced apart from each other and disposed in parallel with each other.

6. The handle of claim 1, further comprising a second connecting part to connect opposite ends of the first and second holders together via the first and second connecting parts.

7. The handle of claim 1, wherein the first connecting part includes:
a rod-shaped axial part;
a first projection; and
a second projection,
wherein the first projection and the second projection are bent in opposite directions from an upper and a lower end of the axial part.

8. The handle of claim 1, wherein the first holder is disposed parallel to the second holder, and
wherein the first connecting part is disposed between the first holder and the second holder such that the first holder and the second holder are spaced apart.

9. The handle of claim 1, wherein a length of the first connecting part is less than a width of the first holder and the second holder.

10. The handle of claim 1, wherein a third angle is an acute angle, the third angle being an addition of the first angle and the second angle.

11. The handle of claim 10, wherein the third angle is in a range of 15° to 25°.

12. The handle of claim 10, wherein a size of the third angle is based on a length between the first mounting face and the second mounting face.

13. The display device of claim 2, wherein a pair of holes is formed in the first holder such that the first holder can fixed to a side wall of a pair of recesses that is formed in an upper portion of a rear face of the display device, and
wherein a pair of holes is formed in the second holder such that the second holder can be fixed to the side wall of the pair of recesses that is formed in the upper portion of the rear face of the display device.

14. The display device according to claim 3, wherein either the first mounting face or the second mounting face is attached to a recess or an edge having a small thickness formed in the rear face of the display.

* * * * *